US011976357B2

(12) United States Patent
Bajaj et al.

(10) Patent No.: US 11,976,357 B2
(45) Date of Patent: May 7, 2024

(54) METHODS FOR FORMING A PROTECTIVE COATING ON PROCESSING CHAMBER SURFACES OR COMPONENTS

(71) Applicant: Applied Materials, Inc., Santa Clara, CA (US)

(72) Inventors: Geetika Bajaj, New Delhi (IN); Yogita Pareek, San Jose, CA (US); Prerna Sonthalia Goradia, Mumbai (IN); Ankur Kadam, Mumbai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/698,549

(22) Filed: Nov. 27, 2019

(65) Prior Publication Data

US 2021/0071300 A1    Mar. 11, 2021

(30) Foreign Application Priority Data

Sep. 9, 2019 (IN) .............................. 201941036160

(51) Int. Cl.
    C23C 16/455    (2006.01)
    C23C 16/02     (2006.01)
    C23C 16/40     (2006.01)
    C23C 16/44     (2006.01)
    H01J 37/32     (2006.01)

(52) U.S. Cl.
    CPC .... *C23C 16/45536* (2013.01); *C23C 16/0272* (2013.01); *C23C 16/40* (2013.01); *C23C 16/4404* (2013.01); *C23C 16/45553* (2013.01); *H01J 37/32467* (2013.01); *H01J 37/32495* (2013.01)

(58) Field of Classification Search
    None
    See application file for complete search history.

(56) References Cited

U.S. PATENT DOCUMENTS

| | | | |
|---|---|---|---|
| 5,496,597 A | 3/1996 | Soininen et al. | |
| 5,711,811 A | 1/1998 | Suntola et al. | |
| 6,182,603 B1 | 2/2001 | Shang et al. | |
| 6,407,435 B1 | 6/2002 | Ma et al. | |
| 6,830,622 B2 | 12/2004 | O'Donnell et al. | |
| 6,858,546 B2 | 2/2005 | Niinisto et al. | |
| 7,351,658 B2 | 4/2008 | Putkonen | |
| 7,927,661 B2 * | 4/2011 | Jones ....................... | C23C 16/40 427/255.6 |
| 8,927,438 B2 | 1/2015 | Kim et al. | |
| 9,449,797 B2 | 9/2016 | Singh et al. | |
| 9,790,582 B2 | 10/2017 | Liu et al. | |
| 10,497,544 B2 | 12/2019 | Singh et al. | |
| 2001/0003015 A1 | 6/2001 | Chang et al. | |
| 2001/0003271 A1 | 6/2001 | Otsuki | |
| 2002/0142611 A1 * | 10/2002 | O'Donnell ......... | H01J 37/32477 264/642 |
| 2005/0064248 A1 * | 3/2005 | O'Donnell .......... | C23C 16/4404 428/702 |
| 2006/0177975 A1 | 8/2006 | Ahn et al. | |
| 2007/0020835 A1 * | 1/2007 | Ahn .................. | H01L 21/31604 438/197 |
| 2007/0169704 A1 | 7/2007 | Hao et al. | |
| 2007/0190266 A1 | 8/2007 | Fu | |
| 2009/0036292 A1 | 2/2009 | Sun et al. | |
| 2012/0125488 A1 | 5/2012 | Sun et al. | |
| 2012/0270409 A1 * | 10/2012 | Kim .................. | H01L 21/02189 438/763 |
| 2013/0288427 A1 * | 10/2013 | Hung ................ | H01L 21/02189 438/104 |
| 2014/0335698 A1 | 11/2014 | Singh et al. | |
| 2015/0307982 A1 | 10/2015 | Firouzdor et al. | |
| 2016/0032163 A1 * | 2/2016 | Kim .................... | C23C 16/4554 427/301 |
| 2016/0087028 A1 | 3/2016 | Hirota et al. | |
| 2016/0307740 A1 | 10/2016 | Kim et al. | |
| 2016/0312351 A1 | 10/2016 | Liu et al. | |

(Continued)

FOREIGN PATENT DOCUMENTS

| | | |
|---|---|---|
| CN | 1505695 A | 6/2004 |
| CN | 107615462 A | 1/2018 |

(Continued)

OTHER PUBLICATIONS

Aspinall et al. MOCVD and ALD of CeO2 Thin Films using a Novel Monomeric CeIV Alkoxide Precursor Chemical Vapor Deposition (2009). vol. 15 pp. 259-261 (Year: 2009).*

Aspinall et al. Ce(IV) Complexes with Donor-Functionalized Alkoxide Ligands: Improved Precursors for Chemical Vapor Deposition of CeO2 (2011). Inorg. Chem. vol. 50, 11644-11652 (Year: 2011).*

Journal of Vacuum Science & Technology A 36, (051502) (2018); doi: 10.1116/1.5026405, "Atomic layer deposition of CeO2 using a heteroleptic cyclopentadienyl-amidinate precursor".

Journal of Vacuum Science & Technology A 34, 031506 (2016); doi: 10.1116/1.4944589, "Atomic layer deposition of cerium oxide for potential use in diesel soot combustion".

Journal of The Electrochemical Society, 158 (10) G217-G220 (2011); Electronic Structure of Cerium Oxide Gate Dielectric Grown by Plasma-Enhanced Atomic Layer Deposition.

(Continued)

*Primary Examiner* — Jose I Hernandez-Kenney
(74) *Attorney, Agent, or Firm* — Patterson + Sheridan, LLP

(57) ABSTRACT

Embodiments of the disclosure provide methods for fabricating or otherwise forming a protective coating containing cerium oxide on processing chamber surfaces and/or components, such as surfaces which are exposed to a plasma within a processing chamber. In one or more embodiments, a method of forming a protective coating within a processing chamber includes depositing a cerium oxide layer on a chamber surface or a chamber component during an atomic layer deposition (ALD) process. The ALD process includes sequentially exposing the chamber surface or the chamber component to a cerium precursor, a purge gas, an oxidizing agent, and the purge gas during an ALD cycle, and repeating the ALD cycle to deposit the cerium oxide layer.

11 Claims, 1 Drawing Sheet

(56) References Cited

U.S. PATENT DOCUMENTS

| | | | |
|---|---|---|---|
| 2016/0365228 A1 | 12/2016 | Singh et al. | |
| 2017/0110293 A1 | 4/2017 | Sun et al. | |
| 2017/0323772 A1 | 11/2017 | Fenwick et al. | |
| 2017/0372874 A9 | 12/2017 | Sun et al. | |
| 2018/0044800 A1 | 2/2018 | Hendrix et al. | |
| 2018/0174866 A9 | 6/2018 | Sun et al. | |
| 2018/0330923 A1* | 11/2018 | Tran | C23C 16/403 |
| 2019/0139743 A1 | 5/2019 | Chen et al. | |
| 2020/0131634 A1* | 4/2020 | Gao | H01L 21/67023 |

FOREIGN PATENT DOCUMENTS

| | | |
|---|---|---|
| CN | 109072432 A | 12/2018 |
| JP | 2003147529 A * | 5/2003 |
| JP | 2004525517 A | 8/2004 |
| JP | 2009203113 A | 9/2009 |
| JP | 2015122486 A | 7/2015 |
| JP | 2016020418 A | 2/2016 |
| JP | 2018506859 A | 3/2018 |
| KR | 20160017710 A | 2/2016 |
| TW | 569335 | 1/2004 |
| TW | 201515143 | 4/2015 |
| TW | 201634265 | 10/2016 |
| TW | 201706427 | 2/2017 |
| TW | 201807223 | 3/2018 |
| WO | WO-2009143456 A1 * | 11/2009 ............. C23C 16/14 |
| WO | 2017149205 A1 | 9/2017 |

OTHER PUBLICATIONS

Journal of Materials Chemistry, 2011, 21, 10903, "Improving solid oxide fuel cells with yttria-doped ceria interlayers by atomic layer deposition".
J. Mater. Chem., 2002, 12, 1828-1832, "Cerium dioxide buffer layers at low temperature by atomic layer deposition".
International Search Report and Written Opinion dated Nov. 17, 2020 for Application No. PCT/US2020/043833.
Golalikhani, M. et al. "Atomic layer deposition of CeO2 using a heteroleptic cyclopentadienyl amidinate precursor". J. Vac. Sci. Technol. A, vol. 36, 2018, 051502-1-051502-7.
Japanese Office Action dated Apr. 25, 2023 for Application No. 2022-514992.
European Office Action dated Sep. 1, 2023 for Application No. 20863668.8.
Japanese Office Action dated Sep. 19, 2023 for Application No. 2022-514992.
Singapore Search Report and Written Opinion dated Sep. 29, 2023 for Application No. 11202201389Q.
Korean Office Action dated Oct. 19, 2023 for Application No. 10-2022-7011421.
Chinese Office Action dated Dec. 26, 2023 for Application No. 202080062730.8.
Aspinall et al., "Ce(IV) Complexes with Donor-Functionalized Alkoxide Ligands: Improved Precursors for Chemical Vapor Deposition of CeO2", Inorganic Chemistry, vol. 50, Dec. 31, 2011; pp. 11644-11654.
Taiwan Office Action dated Feb. 26, 2024 for Application No. 109128041.

* cited by examiner

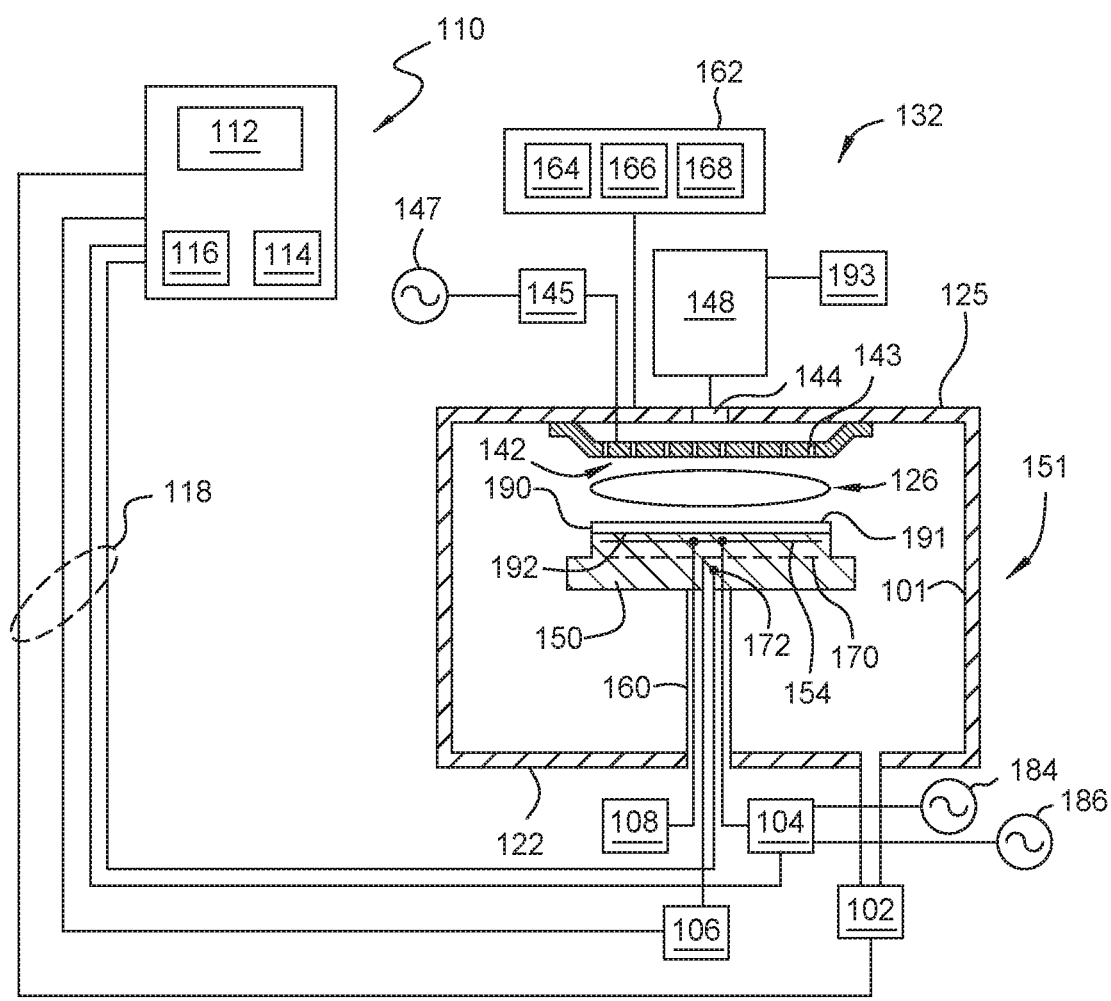

METHODS FOR FORMING A PROTECTIVE COATING ON PROCESSING CHAMBER SURFACES OR COMPONENTS

CROSS-REFERENCE TO RELATED APPLICATIONS

This application claims benefit of Indian Prov. Appl. No. 201941036160, filed Sep. 9, 2019, which is herein incorporated by reference.

BACKGROUND

Field

Embodiments of the present disclosure generally relate to vapor deposition processes, more specifically, to methods for forming protective coatings by atomic layer deposition processes.

Description of the Related Art

The fabrication of microelectronics or integrated circuit devices typically involves a complicated process sequence requiring hundreds of individual steps performed on semiconductors, dielectric and conductive substrates. Examples of these process steps include oxidation, diffusion, ion implantation, thin film deposition, cleaning, etching and lithography. Plasma processes are often used for thin film deposition and etching, which are performed in a plasma chamber. In chemical vapor deposition, reactive species are generated by applying voltages to suitable process gases, and subsequent chemical reactions result in the formation of a thin film on a substrate. In plasma etching, a previously deposited film is exposed to the reactive species in a plasma, often through a patterned mask layer formed in a prior lithography step. Reactions between the reactive species and the deposited film result in the removal, or etching, of the deposited film.

When chamber parts or process kits are exposed to the plasma environment for extended periods, deterioration may occur due to reaction with the plasma species. For example, existing process kits or component parts of a plasma chamber are often made of aluminum containing materials (such as aluminum oxide, aluminum oxynitride or aluminum nitride). Halogen-containing gases, e.g., fluorine- or chlorine-containing gases, are used in etching various material layers in circuit fabrication. It is believed that aluminum containing materials is vulnerable to attack by halogen species, resulting in the formation of various aluminum halides on the surface of component parts. Such etch by-product may come off as particles during processing, resulting in contamination and defects on the substrate during processing. Also, the surfaces and components that are etched have to be eventually replaced which increases expense and downtime to production.

Thus, there is a need for a protective coating on surfaces and components within a processing chamber used in plasma applications.

SUMMARY

Embodiments of the disclosure provide methods for fabricating or otherwise forming a protective coating containing cerium oxide on processing chamber surfaces and/or components, such as surfaces which are exposed to a plasma within a processing chamber. In one or more embodiments, a method of forming a protective coating within a processing chamber includes depositing a cerium oxide layer on a chamber surface or a chamber component during an atomic layer deposition (ALD) process. The ALD process includes sequentially exposing the chamber surface or the chamber component to a cerium precursor, a purge gas, an oxidizing agent, and the purge gas during an ALD cycle, and repeating the ALD cycle to deposit the cerium oxide layer.

In other embodiments, a method of forming a protective coating within a processing chamber includes depositing a cerium oxide layer on a chamber surface or a chamber component during an ALD process, where the chamber surface or the chamber component is heated to a temperature of about 50° C. to about 400° C. during the ALD process. The ALD process includes sequentially exposing the chamber surface or the chamber component to a cerium precursor, a purge gas, an oxidizing agent, and the purge gas during an ALD cycle, and then repeating the ALD cycle to deposit the cerium oxide layer. The cerium precursor can be or include one or more cerium β-diketonate compounds, one or more cerium cyclopentadienyl compounds, one or more cerium alkoxide compounds, one or more cerium amide compounds, one or more cerium acetamidinate compound one or more, adducts thereof, or any combination thereof.

In some embodiments, a method of forming a protective coating within a processing chamber includes depositing an intermediate oxide film on a chamber surface or a chamber component and depositing a cerium oxide layer on the intermediate oxide film during an ALD process. The ALD process includes sequentially exposing the chamber surface or the chamber component to a cerium precursor, a purge gas, an oxidizing agent, and the purge gas during an ALD cycle, and repeating the ALD cycle to deposit the cerium oxide layer to a thickness of about 1 nm to about 100 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 is a schematic diagram of a plasma reactor having at least one chamber component having a coating layer formed therein.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the disclosure provide methods for fabricating or otherwise forming a protective coating containing cerium oxide on processing chamber surfaces and/or components, such as surfaces which are exposed to a plasma within a processing chamber. The protective coating has improved properties, such as enhanced chemical or plasma resistance, over traditional coatings used in plasma chambers. In some examples, an intermediate oxide film is initially deposited on the chamber surface or component and then a cerium oxide layer is deposited on the intermediate oxide film during an atomic layer deposition (ALD) process. The ALD process provides a denser and more conformal film on planar or non-planar surfaces than other deposition processes. Specifically, surfaces with relatively high aspect ratio features are easily and more conformally coated with the protective coating by ALD over other traditional deposition processes. The protective coating can be or contain one or multiple layers or films of the same of varying composition.

The protective coating can be used within a processing chamber where plasma is exposed to inner surfaces and/or components. The plasma can be generated within the processing chamber as well as external or remotely of the processing and subsequently introduced into the processing chamber. In some examples, the protective coating can be used deposited or otherwise formed on inner surfaces and/or components in a processing chamber. Then, the surface or component containing the protective coating can be transferred into and used in another processing chamber.

The methods for fabricating or otherwise forming a protective coating which is resistant to halogen plasmas in general and to the fluorine-containing plasmas which are so problematic in terms of reaction with and erosion of surfaces of the components. Example component parts of the kind which particularly benefit from the materials and methods described herein include plasma processing chamber apparatus such as showerheads for gas distribution, processing chamber walls and lid interior surfaces, processing chamber liners or shields, electrostatic chuck and/or substrate support surfaces, and/or rings and support members, by way of example and not by way of limitation. A protective coating composition of the kind described herein is useful over a surface of aluminum, aluminum alloys, steel, stainless steel, aluminum oxide, aluminum nitride, quartz, silicon carbide, silicon nitride, and/or other types of metallic, ceramic, or glass materials. Use of the protective coatings described and discussed herein will decrease the amount of formed particles and metal contamination which occur during the performance lifetime of the component or surface, and extend the lifetime of the component or surface as well.

In one or more embodiments, the protective coating containing at least cerium oxide is formed within a processing chamber, such as on one or more chamber surfaces and/or one or more chamber components, by ALD. In some examples, the ALD process includes sequentially exposing the chamber surface or the chamber component to one or more cerium precursors, a purge gas, one or more oxidizing agents, and the purge gas during an ALD cycle. The ALD cycle is repeated to deposit or otherwise form the cerium oxide layer.

The cerium precursor can be or include one or more cerium β-diketonate compounds, one or more cerium cyclopentadienyl compounds, one or more cerium alkoxide compounds, one or more cerium amide compounds, one or more cerium acetamidinate compounds, adducts thereof, or any combination thereof.

In some examples, the cerium precursor can be or include one or more cerium β-diketonate compounds. The cerium β-diketonate compound contains a cerium atom and at least one, two, three, or four β-diketonate ligands and can optionally have one or more other types of ligands. One exemplary β-diketonate ligand is 2,2,6,6-tetramethyl-3,5-heptanedione, which is also known as "thd". Exemplary cerium β-diketonate compounds which contain thd can be or include $Ce(thd)_4$, $Ce(thd)_3$, $Ce(thd)_3(phen)$, any adducts thereof, or any combination thereof. The "phen" ligand is also known as 1,10-phenanthroline. See Table 1 for a listing of the full chemical names of the cerium β-diketonate compounds.

In some examples, the cerium precursor can be or include one or more cerium cyclopentadienyl compounds. The cerium cyclopentadienyl compound contains a cerium atom and at least one, two, three, or four cyclopentadienyl ligands and can optionally have one or more other types of ligands. Exemplary cerium cyclopentadienyl compounds can be or include $(Cp)_3Ce$, $(MeCp)_3Ce$, $(EtCp)_3Ce$, $(PrCp)_3Ce$, $(BuCp)_3Ce$, any adduct thereof, or any combination thereof. The cyclopentadienyl ligand, also known as "Cp", can be unsubstituted or can be substituted with one, two, or more groups, such as alkyl groups and the various isomers of the alkyl groups. For example, the MeCp ligand is methylcyclopentadienyl, the EtCp ligand is ethylcyclopentadienyl, the PrCp ligand is propylcyclopentadienyl, where propyl (Pr) includes all isomers, such as n-propyl and/or iso-propyl, and the BuCp ligand is butylcyclopentadienyl, where butyl (Bu) includes all isomers, such as n-butyl, sec-butyl, and/or tert-butyl. See Table 1 for a listing of the full chemical names of the cerium cyclopentadienyl compounds.

In some examples, the cerium precursor can be or include one or more cerium alkoxide compounds. The cerium alkoxide compound contains a cerium atom and at least one, two, three, or four alkoxide ligands and can optionally have one or more other types of ligands. Exemplary cerium alkoxide compounds can be or include $Ce(mmp)_4$ (cerium tetra(1-methoxy-2-methyl-2-propanolate)), $Ce(dmap)_4$ (cerium tetra(1-(dimethylamino)propan-2-olate)), $Ce(dmop)_4$ (cerium tetra(2-(4,4-dimethyl-4,5-dihydrooxazol-2-yl)propan-2-olate)), an adduct thereof, or any combination thereof. See Table 1 for a listing of the full chemical names of the cerium alkoxide compounds.

In some examples, the cerium precursor can be or include one or more cerium amide compounds or cerium acetamidinate compounds. The cerium amide compound and the cerium acetamidinate compound contains a cerium atom and at least one, two, three, or four nitrogen-containing ligands, such as an amide, an amine, and/or an acetamidinate. The cerium amide compound and the cerium acetamidinate can also have one or more other types of ligands, such as β-diketonate, cyclopentadienyl, alkoxide, or other ligands. An exemplary cerium amide compound can be $(hmdsa)_3Ce$ and an exemplary cerium acetamidinate compound can be $(^iPrCp)_2Ce(N-^iPr-amd)$. The "hmdsa" ligand is also known as hexamethyldisilamide. The "N-$^i$Pr-amd" ligand is also known as diisopropylacetamidinate. See Table 1 for a listing of the full chemical names of the cerium amide compounds and the cerium acetamidinate compounds.

TABLE 1

| | Cerium Compound | Formula |
|---|---|---|
| 1 | tetrakis(2,2,6,6-tetramethyl-3,5-heptanedionato) cerium | Ce(thd)$_4$ |
| 2 | tris(2,2,6,6-tetramethyl-3,5-heptanedionato) cerium | Ce(thd)$_3$ |
| 3 | tris(2,2,6,6-tetramethyl-3,5-heptanedionato) (1,10-phenanthroline) cerium | Ce(thd)$_3$(phen) |
| 4 | tris(cyclopentadienyl) cerium | (Cp)$_3$Ce |
| 5 | tris(methylcyclopentadienyl) cerium | (MeCp)$_3$Ce |
| 6 | tris(ethylcyclopentadienyl) cerium | (EtCp)$_3$Ce |
| 7 | tris(propylcyclopentadienyl) cerium | (PrCp)$_3$Ce |
| 8 | tris(butylcyclopentadienyl) cerium | (BuCp)$_3$Ce |
| 9 | cerium tetra(1-methoxy-2-methyl-2-propanolate) | Ce(mmp)$_4$ |
| 10 | cerium tetra(1-(dimethylamino)propan-2-olate) | Ce(dmap)$_4$ |
| 11 | cerium tetra(2-(4,4-dimethyl-4,5-dihydrooxazol-2-yl)propan-2-olate) | Ce(dmop)$_4$ |
| 12 | tris(hexamethyldisilamide) cerium | (hmdsa)$_3$Ce |
| 13 | bis(isopropylcyclopentadienyl) (diisopropylacetamidinate) cerium | ($^i$PrCp)$_2$Ce(N-$^i$Pr-amd) |

In one or more embodiments, the cerium precursor can be or include one or more solvents. The solvent can be or include one or more of toluene, benzene, tetrahydrofuran, pyridine, ethyl ether or other ethers, one or more alkanes (e.g., butane, pentane, hexane, heptane, and/or octane), one or more alcohols (e.g., methanol, ethanol, propanol, and/or butanol), or any combination thereof.

Throughout the ALD process, one or more cerium precursors, one or more oxidizing agents, and a purge and/or carrier are sequentially introduced into the processing chamber. During each ALD cycle, the chamber surfaces and/or the chamber components are sequentially exposed to the one or more cerium precursors and the one or more oxidizing agents. The oxidizing agent can be or include one or more of water, oxygen ($O_2$), atomic oxygen, ozone, nitrous oxide, one or more peroxides (e.g., hydrogen peroxide and/or an organic peroxide), plasmas thereof, or any combination thereof. The purge gas and/or carrier gas can be or include one or more of nitrogen ($N_2$), argon, helium, hydrogen ($H_2$), oxygen ($O_2$), or any combination thereof.

The chamber surface or the chamber component is heated to a temperature of about 30° C., about 50° C., about 80° C., about 100° C., about 120° C. to about 150° C., about 180° C., about 200° C., about 250° C., about 300° C., about 350° C., about 400° C., about 500° C., or greater during the ALD process. For example, the chamber surface or the chamber component is heated to a temperature of about 30° C. to about 500° C., about 30° C. to about 400° C., about 30° C. to about 350° C., about 30° C. to about 300° C., about 30° C. to about 250° C., about 30° C. to about 200° C., about 30° C. to about 150° C., about 30° C. to about 100° C., about 50° C. to about 500° C., about 50° C. to about 400° C., about 50° C. to about 350° C., about 50° C. to about 300° C., about 50° C. to about 250° C., about 50° C. to about 200° C., about 50° C. to about 150° C., about 50° C. to about 100° C., about 100° C. to about 500° C., about 100° C. to about 400° C., about 100° C. to about 350° C., about 100° C. to about 300° C., about 100° C. to about 250° C., about 100° C. to about 200° C., about 100° C. to about 150° C., about 150° C. to about 500° C., about 150° C. to about 400° C., about 150° C. to about 350° C., about 150° C. to about 300° C., about 150° C. to about 250° C., or about 150° C. to about 200° C. during the ALD process.

In one or more embodiments, the vapor deposition process is an ALD process and the method includes sequentially exposing the chamber surface or the chamber component to the cerium precursor and the oxidizing agent to form the cerium oxide layer. Each cycle of the ALD process includes exposing the surface of the chamber surface or the chamber component to the cerium precursor, conducting a pump-purge, exposing the chamber surface or the chamber component to the oxidizing agent, and conducting a pump-purge to form the cerium oxide layer. The order of the cerium precursor and the oxidizing agent can be reversed, such that the ALD cycle includes exposing the surface of the chamber surface or the chamber component to the oxidizing agent, conducting a pump-purge, exposing the chamber surface or the chamber component to the cerium precursor, and conducting a pump-purge to form the cerium oxide layer.

In some examples, during each ALD cycle, the chamber surface or the chamber component is exposed to the cerium precursor for about 0.1 seconds to about 10 seconds, the oxidizing agent for about 0.1 seconds to about 10 seconds, and the pump-purge for about 0.5 seconds to about 30 seconds. In other examples, during each ALD cycle, the chamber surface or the chamber component is exposed to the cerium precursor for about 0.5 seconds to about 3 seconds, the oxidizing agent for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the protective coating or the cerium oxide layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the protective coating or the cerium oxide layer.

In one or more embodiments, the ALD cycle can be repeated until the protective coating or the cerium oxide layer has a predetermined or desired thickness. The protective coating or the cerium oxide layer can have a thickness of about 0.5 nm, about 1 nm, about 2 nm, about 5 nm, about 8 nm, about 10 nm, about 12 nm, about 15 nm, about 18 nm, or about 20 nm to about 22 nm, about 25 nm, about 30 nm, about 35 nm, about 40 nm, about 50 nm, about 60 nm, about 80 nm, about 100 nm, about 150 nm, about 200 nm, or greater. For example, the protective coating or the cerium oxide layer can have a thickness of about 1 nm to about 200 nm, about 1 nm to about 150 nm, about 1 nm to about 100 nm, about 1 nm to about 80 nm, about 1 nm to about 50 nm, about 1 nm to about 30 nm, about 1 nm to about 20 nm, about 1 nm to about 10 nm, about 1 nm to about 5 nm, about 10 nm to about 200 nm, about 10 nm to about 150 nm, about 10 nm to about 100 nm, about 10 nm to about 80 nm, about 10 nm to about 50 nm, about 10 nm to about 30 nm, about 10 nm to about 20 nm, about 20 nm to about 200 nm, about 20 nm to about 150 nm, about 20 nm to about 100 nm, about 20 nm to about 80 nm, about 20 nm to about 50 nm, about 20 nm to about 30 nm, or about 20 nm to about 25 nm.

The protective coating or the cerium oxide layer can contain multiple sublayers formed or otherwise deposited during the ALD process. A sublayer is formed or otherwise deposited by each cycle of the ALD process. The protective coating or the cerium oxide layer can include 2, 3, 4, 5, 6, 8, about 10, about 12, or about 15 sublayers to about 18, about 20, about 25, about 30, about 40, about 50, about 65, about 80, about 100, about 120, about 150, about 200, about 250, about 300, about 350, about 400, about 500, about 800, about 1,000, or more sublayers. For example, the protective coating or the cerium oxide layer can include 2 sublayers to about 1,000 sublayers, 2 sublayers to about 800 sublayers, 2 sublayers to about 500 sublayers, 2 sublayers to about 300 sublayers, 2 sublayers to about 250 sublayers, 2 sublayers to about 200 sublayers, 2 sublayers to about 150 sublayers, 2 sublayers to about 120 sublayers, 2 sublayers to about 100 sublayers, 2 sublayers to about 80 sublayers, 2 sublayers to about 50 sublayers, 2 sublayers to about 30 sublayers, 2 sublayers to about 20 sublayers, 2 sublayers to about 15 sublayers, 2 sublayers to about 10 sublayers, 2 sublayers to 5 sublayers, about 8 sublayers to about 1,000 sublayers, about 8 sublayers to about 800 sublayers, about 8 sublayers to about 500 sublayers, about 8 sublayers to about 300 sublayers, about 8 sublayers to about 250 sublayers, about 8 sublayers to about 200 sublayers, about 8 sublayers to about 150 sublayers, about 8 sublayers to about 120 sublayers, about 8 sublayers to about 100 sublayers, about 8 sublayers to about 80 sublayers, about 8 sublayers to about 50 sublayers, about 8 sublayers to about 30 sublayers, about 8 sublayers to about 20 sublayers, about 8 sublayers to about 15 sublayers, about 8 sublayers to about 10 sublayers, about 20 sublayers to about 1,000 sublayers, about 20 sublayers to about 800 sublayers, about 20 sublayers to about 500 sublayers, about 20 sublayers to about 300 sublayers, about 20 sublayers to about 250 sublayers, about 20 sublayers to about 200 sublayers, about 20 sublayers to about 150 sublayers, about 20 sublayers to about 120 sublayers, about 20 sublayers to about 100 sublayers, about 20 sublayers to about 80 sublayers, about 20 sublayers to about 50 sublayers, about 20 sublayers to about 30 sublayers, about 50 sublayers to about 1,000 sublayers, about 50 sublayers to about 500 sublayers, about 50 sublayers to about 350 sublayers, about 50 sublayers to about 300 sublayers, about 50 sublayers to about 250 sublayers, about 50 sublayers to about 150 sublayers, or about 50 sublayers to about 100 sublayers to form the protective coating or the cerium oxide layer.

In one or more embodiments, the chamber surface or the chamber component contains an intermediate oxide film disposed thereon and the cerium oxide is deposited or otherwise formed on the intermediate oxide film. The intermediate layer can provide adhesion and other benefits for the cerium oxide. The intermediate oxide film can be or include one or more oxide materials. Exemplary oxide materials can be or include aluminum oxide, lanthanum oxide, hafnium oxide, yttrium oxide, zirconium oxide, alloys thereof, dopants thereof, or any combination thereof.

FIG. 1 is a cross-sectional view of a processing chamber 132 suitable for performing a deposition process to deposit or otherwise form the protective coating containing a cerium oxide layer, according to one or more embodiments described and discussed herein. In some embodiments, an intermediate oxide film is deposited or otherwise formed on the chamber surface or the chamber component and then the cerium oxide is deposited or otherwise formed on the intermediate oxide film. The processing chamber 132 can perform thermal and/or plasma processes. For example, the processing chamber 132 can be used to perform thermal chemical vapor deposition (CVD), plasma-enhanced CVD (PE-CVD), thermal ALD, plasma-enhanced ALD (PE-ALD), epitaxy growth/deposition, physical vapor deposition (PVD), sputtering, as well as plasma etching or cleaning, and other processes. The surfaces of these chamber components that may benefit from the interface and the protective coating described below.

The processing chamber 132 includes a chamber body 151. The chamber body 151 includes a chamber lid 125, a sidewall 101 and a bottom wall 122 that define an interior volume 126. A substrate support pedestal 150 is provided in the interior volume 126 of the chamber body 151. The pedestal 150 may be fabricated from aluminum, ceramic, aluminum nitride, and other suitable materials. In one or more embodiments, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber body 151 using a lift mechanism (not shown).

The pedestal 150 may include an embedded heater element 170 suitable for controlling the temperature of a substrate 190 supported on the pedestal 150. In one or more embodiments, the pedestal 150 may be resistively heated by applying an electric current from a power supply 106 to the heater element 170. In one or more embodiments, the heater element 170 may be made of a nickel-chromium wire encapsulated in a nickel-iron-chromium alloy (e.g., INCOLOY® alloy) sheath tube. The electric current supplied from the power supply 106 is regulated by the controller 110 to control the heat generated by the heater element 170, thus maintaining the substrate 190 and the pedestal 150 at a substantially constant temperature during film deposition at any suitable temperature range. In other embodiments, the pedestal may be maintained at room temperature as needed. In some embodiments, the pedestal 150 may also include a chiller (not shown) as needed to cool the pedestal 150 at a range lower than room temperature as needed. The supplied electric current may be adjusted to selectively control the temperature of the pedestal 250 to be about 50° C. to about 700° C.

A temperature sensor 172, such as a thermocouple, may be embedded in the substrate support pedestal 150 to monitor the temperature of the pedestal 150 in a conventional manner. The measured temperature is used by the controller 110 to control the power supplied to the heater element 170 to maintain the substrate at a desired temperature.

The pedestal 150 generally includes a plurality of lift pins (not shown) disposed therethrough that are configured to lift the substrate 190 from the pedestal 150 and facilitate exchange of the substrate 190 with a robot (not shown) in a conventional manner.

The pedestal 150 contains at least one electrode 192 for retaining the substrate 190 on the pedestal 150. The electrode 192 is driven by a chucking power source 108 to develop an electrostatic force that holds the substrate 190 to the pedestal surface, as is conventionally known. Alternatively, the substrate 190 may be retained to the pedestal 150 by clamping, vacuum or gravity.

In one or more embodiments, the pedestal 150 is configured as a cathode having the electrode 192 embedded therein coupled to at least one RF bias power source, shown in FIG. 1 as two RF bias power sources 184, 186. Although the example depicted in FIG. 1 shows two RF bias power sources, 184, 186, it is noted that the number of the RF bias power sources may be any number as needed. The RF bias power sources 184, 186 are coupled between the electrode 192 disposed in the pedestal 150 and another electrode, such as a gas distribution plate 142 or chamber lid 125 of the processing chamber 132. The RF bias power source 184, 186 excites and sustains a plasma discharge formed from the gases disposed in the processing region of the processing chamber 132.

In the embodiment depicted in FIG. 1, the dual RF bias power sources 184, 186 are coupled to the electrode 192 disposed in the pedestal 150 through a matching circuit 104. The signal generated by the RF bias power source 184, 186 is delivered through matching circuit 104 to the pedestal 150 through a single feed to ionize the gas mixture provided in the processing chamber 132, thereby providing ion energy necessary for performing a deposition or other plasma enhanced process. The RF bias power sources 184, 186 are generally capable of producing an RF signal having a frequency of from about 50 kHz to about 200 MHz and a power of 0 watts to about 5,000 watts.

A vacuum pump 102 is coupled to a port formed in the bottom 122 of the chamber body 151. The vacuum pump 102 is used to maintain a desired gas pressure in the chamber body 151. The vacuum pump 102 also evacuates post-processing gases and by-products of the process from the chamber body 151.

The processing chamber 132 includes one or more gas delivery passages 144 coupled through the chamber lid 125 of the processing chamber 132. The gas delivery passages 144 and the vacuum pump 102 are positioned at opposite ends of the processing chamber 132 to induce laminar flow within the interior volume 126 to minimize particulate contamination.

The gas delivery passage 144 is coupled to the gas panel 193 through a remote plasma source (RPS) 148 to provide a gas mixture into the interior volume 126. In one or more embodiments, the gas mixture supplied through the gas delivery passage 144 may be further delivered through a gas distribution plate 142 disposed below the gas delivery passage 144. In one example, the gas distribution plate 142 having a plurality of apertures 143 is coupled to the chamber lid 125 of the chamber body 151 above the pedestal 150. The apertures 143 of the gas distribution plate 142 are utilized to introduce process gases from the gas panel 193 into the chamber body 151. The apertures 143 may have different sizes, number, distributions, shape, design, and diameters to facilitate the flow of the various process gases for different process requirements. A plasma is formed from the process gas mixture exiting the gas distribution plate 142 to enhance thermal decomposition of the process gases resulting in the deposition of material on the surface 191 of the substrate 190.

The gas distribution plate 142 and substrate support pedestal 150 may be formed a pair of spaced apart electrodes in the interior volume 126. One or more RF sources 147 provide a bias potential through a matching network 145 to the gas distribution plate 142 to facilitate generation of a plasma between the gas distribution plate 142 and the pedestal 150. Alternatively, the RF sources 147 and matching network 145 may be coupled to the gas distribution plate 142, substrate support pedestal 150, or coupled to both the gas distribution plate 142 and the substrate support pedestal 150, or coupled to an antenna (not shown) disposed exterior to the chamber body 151. In one or more embodiments, the RF sources 147 may provide between about 10 watts and about 3,000 watts at a frequency of about 30 kHz to about 13.6 MHz. Alternatively, the RF source 147 may be a microwave generator that provide microwave power to the gas distribution plate 142 that assists generation of the plasma in the interior volume 126.

Examples of gases that may be supplied from the gas panel 193 may include one or more fluorine-containing gases, one or more chlorine-containing gases, one or more oxygen-containing gases, one or more hydrogen-containing gases, a purge gas, a carrier gas, or any combination thereof. Exemplary purge gas and/or carrier gas can be or include one or more of nitrogen ($N_2$), argon, helium, hydrogen ($H_2$), oxygen ($O_2$), or any combination thereof.

In some embodiments, the remote plasma source (RPS) 148 may be alternatively coupled to the gas delivery passages 144 to assist in forming a plasma from the gases supplied from the gas panel 193 into the in the interior volume 126. The remote plasma source 148 provides plasma formed from the gas mixture provided by the gas panel 193 to the processing chamber 132.

In one or more embodiments, the processing chamber 132 is configured to perform thermal ALD and/or PE-ALD processes. An ALD process system 162 is coupled to the processing chamber 132. The ALD process system 162 can include one, two, three, or more sources 164, 166, and 168 fluidly coupled to the chamber lid 125 and/or the chamber body 151. The sources 164, 166, and 168 include chemical precursors, carrier gas, purge gas, and/or other sources of compounds and/or gases used in the ALD process. In one or more examples, the source 164 contains one or more cerium precursor, the source 166 contains one or more oxidizing agents or oxygen sources, and the source 168 contains one or more purge or carrier gases. Although not shown, the ALD process system 162 can also include valves, conduits, controllers, computer system, and other components utilized to perform ALD processes. Each of the sources 164, 166, and 168 is independently in fluid communication with the gas distribution plate 142 via the chamber lid 125 and/or the chamber body 151. For example, as depicted in FIG. 1, the sources 164, 166, and 168 pass through the chamber lid 125 and are independently in fluid communication with the gas distribution plate 142.

The controller 110 includes a central processing unit (CPU) 112, a memory 116, and a support circuit 114 utilized to control the process sequence and regulate the gas flows from the gas panel 193. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing chamber 132 are handled through numerous signal cables collectively referred to as signal buses 118, some of which are illustrated in FIG. 1. In one or more embodiments, the controller 110 is used to operate the RPS 148 and/or the ALD process system 162.

It is noted that all of the above described chamber component, such as the gas distribution plate 142, or pedestal 150, may have a coating layer along with the intermediate oxide film fabricated by the method described below to enhance the surface protection and chemical/plasma resistance.

Surfaces of the chamber components (e.g., the base structure) often in direct contact and/or under exposure to plasma and/or aggressive radicals. Thus, a robust surface finish is required and desired to protect the chamber components from being consumed by the hydrogen and/or halogen radicals generated in a plasma process. Without the protective coating with the strong bonding to the base structure assisted by the intermediate oxide film, the base structure composed of silica or aluminum are often attacked by the hydrogen and/or halogen radicals, thus reducing process efficiency as well as generating process byproducts. For example, aluminum surfaces from the base structure may be transformed into aluminum fluoride or aluminum hydride after the plasma process. As total chamber run time increases, the surface layer of aluminum fluoride grows thicker, resulting in particle generation that pollutes and contaminates the substrate processed in the processing chamber.

The protective coating (e.g., cerium oxide layer) formed on the intermediate oxide film can provide a relatively chemical inert and/or high plasma resistance that would consume substantially fewer, if any, hydrogen/halogen radicals as compared to conventional surfaces. Accordingly, coating the surfaces of chamber components that are exposed to plasma and/or radicals, such as hydrogen and/or halogen radicals, with the protective coating improves chamber performance and enables the formation of high quality films formed on the substrate disposed in the processing chamber during a plasma process. The protective coating along with strong interface control provided by the intermediate oxide film on processing chamber surfaces may substantially reduce, if not eliminate, the decrease of chamber performance over time. Additionally, coating chamber surfaces with the protective coating and the intermediate oxide film improves the plasma erosion resistance of the inner surfaces of the processing chamber.

It is noted that the base structure described herein may be used for any suitable processing chamber components including the walls of the chamber, any components contained within the processing chamber, such as, for example a showerhead, a baffle, a blocker plate, and a substrate support, and any components coupled to the chamber, such as, for example, a remote plasma source system, a gas delivery system, and a vacuum system. Representative processing surfaces that may benefit from the protective coating along with the intermediate oxide film are illustrated in the processing chamber 132 depicted in FIG. 1.

As the protective coating along with the intermediate oxide film formed on the base structure has a relatively robust structure and interface bonding structure, upon coating such coating layer and the intermediate oxide film on the chamber component in a processing chamber, such as the processing chamber 132 depicted in FIG. 1, the protective coating may maintain a good surface condition while undergoing the attack of the aggressive plasma species during a plasma process. Thus, the likelihood of generating particles or contamination from a chamber wall, a substrate support, a gas distribution plate or other chamber components from the processing chamber is reduced.

Embodiments of this disclosure can be used to fabricate or otherwise form a protective coating containing cerium oxide deposited by ALD processes. The protective coating is formed on surfaces, parts, and/or components of a processing chamber used in a variety of applications. The enhanced protective coated surfaces and components are suitable for use in corrosive environments such as those encountered in plasma processes. A variety of plasma deposition and etch chambers may benefit from the teachings disclosed herein. It is contemplated that other suitable plasma reactors, including those from other process types, may be adapted to benefit from the disclosure.

Embodiments of the present disclosure further relate to any one or more of the following paragraphs 1-21:

1. A method of forming a protective coating within a processing chamber, comprising: depositing a cerium oxide layer on a chamber surface or a chamber component during an atomic layer deposition (ALD) process, wherein the ALD process comprises: sequentially exposing the chamber surface or the chamber component to a cerium precursor, a purge gas, an oxidizing agent, and the purge gas during an ALD cycle; and repeating the ALD cycle to deposit the cerium oxide layer.

2. A method of forming a protective coating within a processing chamber, comprising: depositing a cerium oxide layer on a chamber surface or a chamber component during an atomic layer deposition (ALD) process, wherein the chamber surface or the chamber component is heated to a temperature of about 50° C. to about 400° C. during the ALD process, and wherein the ALD process comprises: sequentially exposing the chamber surface or the chamber component to a cerium precursor, a purge gas, an oxidizing agent, and the purge gas during an ALD cycle, wherein the cerium precursor comprises a cerium β-diketonate compound, a cerium cyclopentadienyl compound, a cerium alkoxide compound, a cerium amide compound, a cerium acetamidinate compound, an adduct thereof, or any combination thereof; and repeating the ALD cycle to deposit the cerium oxide layer.

3. A method of forming a protective coating within a processing chamber, comprising: depositing an intermediate oxide film on a chamber surface or a chamber component; and depositing a cerium oxide layer on the intermediate oxide film during an atomic layer deposition (ALD) process, wherein the ALD process comprises: sequentially exposing the chamber surface or the chamber component to a cerium precursor, a purge gas, an oxidizing agent, and the purge gas during an ALD cycle; and repeating the ALD cycle to deposit the cerium oxide layer to a thickness of about 1 nm to about 100 nm.

4. The method according to any one of paragraphs 1-3, wherein the cerium precursor comprises a cerium β-diketonate compound, a cerium cyclopentadienyl compound, a cerium alkoxide compound, a cerium amide compound, a cerium acetamidinate compound, an adduct thereof, or any combination thereof.

5. The method according to any one of paragraphs 1-4, wherein the cerium precursor comprises a cerium β-diketonate compound.

6. The method according to any one of paragraphs 1-5, wherein the cerium β-diketonate compound is $Ce(thd)_4$, $Ce(thd)_3$, $Ce(thd)_3(phen)$, an adduct thereof, or any combination thereof.

7. The method according to any one of paragraphs 1-6, wherein the cerium precursor comprises a cerium cyclopentadienyl compound.

8. The method according to any one of paragraphs 1-7, wherein the cerium cyclopentadienyl compound is $(Cp)_3Ce$, $(MeCp)_3Ce$, $(EtCp)_3Ce$, $(PrCp)_3Ce$, $(BuCp)_3Ce$, an adduct thereof, or any combination thereof.

9. The method according to any one of paragraphs 1-8, wherein the cerium precursor comprises a cerium alkoxide compound.

10. The method according to any one of paragraphs 1-9, wherein the cerium alkoxide compound is $Ce(mmp)_4$ (cerium tetra(1-methoxy-2-methyl-2-propanolate)), $Ce(dmap)_4$ (cerium tetra(1-(dimethylamino)propan-2-olate)), $Ce(dmop)_4$ (cerium tetra(2-(4,4-dimethyl-4,5-dihydrooxazol-2-yl)propan-2-olate)), an adduct thereof, or any combination thereof.

11. The method according to any one of paragraphs 1-10, wherein the cerium precursor comprises a cerium amide compound or a cerium acetamidinate compound.

12. The method according to any one of paragraphs 1-11, wherein the cerium precursor is $(hmdsa)_3Ce$ or $(^iPrCp)_2Ce(N-^iPr-amd)$.

13. The method according to any one of paragraphs 1-12, wherein the oxidizing agent comprises water, oxygen ($O_2$), atomic oxygen, ozone, nitrous oxide, a peroxide, a plasma thereof, or any combination thereof.

14. The method according to any one of paragraphs 1-13, wherein the ALD cycle is repeated until the cerium oxide layer has a thickness of about 1 nm to about 100 nm.

15. The method according to any one of paragraphs 1-14, wherein the chamber surface or the chamber component is heated to a temperature of about 50° C. to about 400° C. during the ALD process.

16. The method according to any one of paragraphs 1-15, wherein the chamber surface or the chamber component is heated to a temperature of about 100° C. to about 350° C. during the ALD process.

17. The method according to any one of paragraphs 1-16, wherein the chamber surface or the chamber component contains an intermediate oxide film disposed thereon.

18. The method according to any one of paragraphs 1-17, wherein the cerium oxide is deposited on the intermediate oxide film.

19. The according to any one of paragraphs 1-18, wherein the intermediate oxide film comprises aluminum oxide, lanthanum oxide, hafnium oxide, yttrium oxide, zirconium oxide, alloys thereof, dopants thereof, or any combination thereof.

20. The according to any one of paragraphs 1-19, wherein the chamber surface and/or the chamber component are within the processing chamber.

21. A processing chamber and/or a chamber component containing the protective coating according to any one of paragraphs 1-20.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

The invention claimed is:

1. A method of forming a protective coating within a processing chamber, comprising:
    depositing a cerium oxide layer on a chamber component during an atomic layer deposition (ALD) process, wherein the chamber component is a processing chamber liner or shield or a ring, and wherein the ALD process comprises:
    heating the chamber component to a temperature of about 50° C. to about 400° C.;
    sequentially exposing the chamber component to a cerium precursor, a purge gas, an oxidizing agent, and the purge gas during an ALD cycle, wherein the cerium precursor comprises an alcohol selected from methanol, ethanol, propanol, butanol, or any combination thereof, and wherein the cerium precursor comprises $(Cp)_3Ce$, $(MeCp)_3Ce$, $(EtCp)_3Ce$, $(PrCp)_3Ce$, $(BuCp)_3Ce$, $Ce(mmp)_4$ (cerium tetra(1-methoxy-2-methyl-2-propanolate)), $Ce(dmap)_4$ (cerium tetra(1-(dimethylamino)propan-2-olate)), $Ce(dmop)_4$ (cerium tetra(2-(4,4-dim ethyl-4,5-dihydrooxazol-2-yl)propan-2-olate)), $(hmdsa)_3Ce$, an adduct thereof, or any combination thereof; and
    repeating the ALD cycle from about 10 times to about 1,000 times to deposit the cerium oxide layer comprising about 10 sublayers of cerium oxide to about 1,000 sublayers of cerium oxide.

2. The method of claim 1, wherein the oxidizing agent comprises water, oxygen ($O_2$), atomic oxygen, ozone, nitrous oxide, a peroxide, a plasma thereof, or any combination thereof.

3. The method of claim 1, wherein the ALD cycle is repeated until the cerium oxide layer has a thickness of about 1 nm to about 100 nm.

4. The method of claim 1, wherein the temperature is about 80° C. to about 400° C. during the ALD process, and wherein the cerium precursor further comprises a solvent selected from toluene, benzene, tetrahydrofuran, pyridine, ethyl ether, one or more alkanes, or any combination thereof.

5. The method of claim 1, wherein the temperature is about 100° C. to about 350° C. during the ALD process, and wherein the chamber component is the chamber liner or shield.

6. The method of claim 1, wherein the chamber component contains an intermediate oxide film disposed thereon, and wherein the cerium oxide is deposited on the intermediate oxide film.

7. The method of claim 6, wherein the intermediate oxide film comprises aluminum oxide, lanthanum oxide, hafnium oxide, yttrium oxide, zirconium oxide, alloys thereof, dopants thereof, or any combination thereof.

8. A method of forming a protective coating within a processing chamber, comprising:
depositing a cerium oxide layer on a chamber component during an atomic layer deposition (ALD) process, wherein the chamber component is a processing chamber liner or shield or a ring, and wherein the ALD process comprises:
sequentially exposing the chamber component to a cerium precursor, a purge gas, an oxidizing agent comprising nitrous oxide, and the purge gas during an ALD cycle, wherein the cerium precursor comprises a solvent and at least one selected from $(Cp)_3Ce$, $(MeCp)_3Ce$, $(EtCp)_3Ce$, $(PrCp)_3Ce$, $(BuCp)_3Ce$, $Ce(mmp)_4$ (cerium tetra(1-methoxy-2-methyl-2-propanolate)), $Ce(dmap)_4$ (cerium tetra(1-(dimethylamino)propan-2-olate)), $Ce(dmop)_4$ (cerium tetra(2-(4,4-dimethyl-4,5-dihydrooxazol-2-yl)propan-2-olate)), $(hmdsa)_3Ce$, an adduct thereof, or any combination thereof, and wherein the solvent comprises an alcohol selected from methanol, ethanol, propanol, butanol, or any combination thereof; and
repeating the ALD cycle to deposit the cerium oxide layer comprising about 10 sublayers of cerium oxide to about 1,000 sublayers of cerium oxide.

9. The method of claim 8, wherein the chamber component is heated to a temperature in a range from about 100° C. to about 350° C. during the ALD process, and wherein the chamber component is the ring.

10. A method of forming a protective coating within a processing chamber, comprising:
heating a chamber component to a temperature of about 50° C. to about 400° C., wherein the chamber component is a processing chamber liner or shield or a ring;
depositing an intermediate oxide film on a chamber component; and
depositing a cerium oxide layer on the intermediate oxide film during an atomic layer deposition (ALD) process, wherein the ALD process comprises:
sequentially exposing the chamber component to a cerium precursor, a purge gas, an oxidizing agent comprising nitrous oxide, and the purge gas during an ALD cycle, wherein the cerium precursor comprises a solvent and at least one of: cerium tetra(1-methoxy-2-methyl-2-propanolate), cerium tetra(1-(dimethylamino)propan-2-olate), cerium tetra(2-(4,4-dimethyl-4,5-dihydrooxazol-2-yl)propan-2-olate), tris(hexamethyldisilamide) cerium, an adduct thereof, or any combination thereof, and wherein the solvent comprises an alcohol selected from methanol, ethanol, propanol, butanol, or any combination thereof; and
repeating the ALD cycle from about 10 times to about 1,000 times to deposit the cerium oxide layer having a thickness of about 1 nm to about 100 nm and comprising about 10 sublayers of cerium oxide to about 1,000 sublayers of cerium oxide.

11. The method of claim 10, wherein the intermediate oxide film comprises aluminum oxide, lanthanum oxide, hafnium oxide, yttrium oxide, zirconium oxide, alloys thereof, dopants thereof, or any combination thereof, and wherein the chamber component is the chamber liner or shield.

* * * * *